United States Patent
Ragonese et al.

(10) Patent No.: US 9,520,828 B2
(45) Date of Patent: *Dec. 13, 2016

(54) POWER OSCILLATOR APPARATUS WITH TRANSFORMER-BASED POWER COMBINING

(71) Applicant: STMicroelectronics S.r.l., Agrate Brianza (IT)

(72) Inventors: Egidio Ragonese, Aci Catena (IT); Vincenzo Fiore, Fiumefreddo di Sicilia (IT); Nunzio Spina, Catania (IT); Giuseppe Palmisano, S. Giovanni la Punta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 14/942,200

(22) Filed: Nov. 16, 2015

(65) Prior Publication Data

US 2016/0072435 A1 Mar. 10, 2016

Related U.S. Application Data

(62) Division of application No. 14/216,037, filed on Mar. 17, 2014, now Pat. No. 9,240,752.

(30) Foreign Application Priority Data

Mar. 26, 2013 (IT) .............................. MI2013A0454

(51) Int. Cl.
*H03B 1/02* (2006.01)
*H03B 5/02* (2006.01)
*H03B 5/12* (2006.01)

(52) U.S. Cl.
CPC .............. *H03B 5/1212* (2013.01); *H03B 1/02* (2013.01); *H03B 5/02* (2013.01); *H03B 5/1228* (2013.01);
(Continued)

(58) Field of Classification Search
CPC .............. H03B 1/02; H03B 5/02; H03B 5/08; H03B 5/12; H03B 5/1206; H03B 5/1212; H03B 5/1215; H03B 5/1228; H03B 5/1296; H03B 27/00; H03B 2200/0076; H03B 2200/0078
(Continued)

(56) References Cited

U.S. PATENT DOCUMENTS 3,002,142 A * 9/1961 Jensen .............. H02M 7/53835
307/106
3,046,495 A * 7/1962 Faries ............... H02M 7/53835
331/113 A
(Continued)

FOREIGN PATENT DOCUMENTS

CN 102170289 A 8/2011
KR 101138487 B1 4/2012

OTHER PUBLICATIONS

A. Allam, et al, "Synchronization of mutually coupled LC-oscillators," in IEEE ISCAS, May 2006.
(Continued)

*Primary Examiner* — Levi Gannon
(74) *Attorney, Agent, or Firm* — Gardere Wynne Sewell, LLP

(57) ABSTRACT

An oscillator circuit includes first and second oscillators arranged in a series configuration between a supply voltage node and a reference voltage node. The first and second oscillators are configured to receive a synchronizing signal for controlling synchronization in frequency and phase. An
(Continued)

electromagnetic network provided to couple the first and the second oscillators includes a transformer with a primary circuit and a secondary circuit. The primary circuit includes a first portion coupled to the first oscillator and second portion coupled to the second oscillator. The first and second portions are connected by a circuit element for reuse of current between the first and second oscillators. The oscillator circuit is fabricated as an integrated circuit device wherein the electromagnetic network is formed in metallization layers of the device. The secondary circuit generates an output power combining power provided from the first and second portions of the primary circuit.

26 Claims, 6 Drawing Sheets

(52) U.S. Cl.
CPC ..... *H03B 5/1296* (2013.01); *H03B 2200/0076* (2013.01)

(58) Field of Classification Search
USPC .............. 331/46, 50, 52, 55, 117 FE, 117 R, 331/167, 172
See application file for complete search history.

(56) References Cited

U.S. PATENT DOCUMENTS

| | | | |
|---|---|---|---|
| 5,473,323 A | 12/1995 | Kreft | |
| 7,019,611 B2 | 3/2006 | Kaku et al. | |
| 7,295,076 B2 | 11/2007 | Kim et al. | |
| 7,633,352 B2* | 12/2009 | El Rai | H03J 3/20 331/167 |
| 7,961,056 B2 | 6/2011 | Taylor et al. | |
| 8,058,934 B2 | 11/2011 | Rangarajan et al. | |
| 8,212,625 B2 | 7/2012 | Lee et al. | |
| 8,711,954 B2 | 4/2014 | Florence et al. | |
| 8,723,609 B2 | 5/2014 | Chang et al. | |
| 8,948,276 B2 | 2/2015 | Kaeriyama | |
| 8,957,739 B2 | 2/2015 | Lu et al. | |
| 2006/0120115 A1 | 6/2006 | Chen et al. | |
| 2007/0170909 A1 | 7/2007 | Vorenkamp et al. | |
| 2008/0007366 A1 | 1/2008 | Bevilacqua et al. | |
| 2008/0106343 A1 | 5/2008 | Jang et al. | |
| 2008/0284534 A1 | 11/2008 | El Rai | |
| 2009/0213625 A1 | 8/2009 | Adler | |
| 2010/0271086 A1 | 10/2010 | Bao et al. | |
| 2011/0050354 A1 | 3/2011 | Hirashiki et al. | |
| 2011/0057732 A1 | 3/2011 | Taylor et al. | |
| 2011/0148535 A1 | 6/2011 | Lee | |
| 2012/0256290 A1 | 10/2012 | Renna et al. | |
| 2012/0286879 A1 | 11/2012 | Nylen | |
| 2013/0024046 A1 | 1/2013 | Toriya et al. | |
| 2013/0148747 A1 | 6/2013 | Puchiano et al. | |
| 2014/0070898 A1* | 3/2014 | Shirinfar | H03B 5/1228 331/117 FE |

OTHER PUBLICATIONS

Italian Search Report and Written Opinion for IT MI2013A000454 mailed Oct. 10, 2013 (8 pages).
Jeong Ki Kim et al.; , "A current-reuse quadrature VCO for wireless body area networks," in IEEE/NIH LiSSA, pp. 55-58, 2011.
Khan, T.; Raahemifar, K.; , "A low power current reused quadrature VCO for biomedical applications," in IEEE ISCAS, pp. 669-672, May 24-27, 2009.
Le Zheng et al., "Design and analysis of a current-reuse transmitter for ultra-low power applications," in IEEE ISCAS, pp. 1317-1320, May 24-27, 2009.
Oliveira, L.B. et al. , "Synchronization of two LC-oscillators using capacitive coupling," in IEEE ISCAS, pp. 2322-2325, 2008.
Tomita et al., "1-W 3.3-16.3-V boosting wireless power transfer circuits with vector summing power controller," IEEE JSSC, vol. 47, pp. 2576-2585, Nov. 2012.
Tzuen-Hsi Huang et al. , "A 1 V 2.2 mW 7 GHz CMOS quadrature VCO using current-reuse and cross-coupled transformer-feedback technology," IEEE MWCL, vol. 18, pp. 698-700, Oct. 2008.
Youngjae Lee et al. , "Current reuse cross-coupling CMOS VCO using the center-tapped transformer in LC tank for digitally controlled oscillator," in IEEE RFIC, pp. 549-552, 2008.

* cited by examiner

POWER OSCILLATOR APPARATUS WITH TRANSFORMER-BASED POWER COMBINING

PRIORITY CLAIM

This application is a divisional application from U.S. Application for patent Ser. No. 14/216,037 filed Mar. 17, 2014, which claims priority from Italian Application for Patent No. MI2013A000454 filed Mar. 26, 2013, the disclosures of which are incorporated by reference.

TECHNICAL FIELD

The present disclosure relates to a power oscillator apparatus with transformer-based power combining.

BACKGROUND

It is known in the state of the art the use of circuit apparatus comprising at least two oscillators coupled by means of a proper network. The main applications of such an apparatus are the implementation of both quadrature signals and voltage-controlled oscillators with low phase-noise. For this approach, the design of the coupling network is the main issue. The coupling network may be of the active type, as disclosed in Jeong Ki Kim et al., "A current-reuse quadrature VCO for wireless body area networks," IEEE/NIH LiSSA, pp. 55-58, 2011 (the disclosure of which is incorporated by reference), or capacitive type as disclosed in Oliveira, L. B. et al., "Synchronization of two LC-oscillators using capacitive coupling," IEEE ISCAS, pp. 2322-2325, 2008 (the disclosure of which is incorporated by reference), or inductive type as disclosed in Tzuen-Hsi Huang et al., "A 1 V 2.2 mW 7 GHz CMOS quadrature VCO using current-reuse and cross-coupled transformer-feedback technology," IEEE MWCL, vol. 18, pp. 698-700, October 2008 (the disclosure of which is incorporated by reference).

Also it is known in the state of the art the use of power combining techniques to increase the overall output power in several applications. Due to technology limits, (e.g., breakdown, electro-migration constraints, thermal issues, etc.) the power level delivered by a single power stage is often below the application requirements, thus a multistage solution is required. When it comes about dc/ac conversion, transformer-based power-combining is the straight-forward solution. An example of power-combining system is disclosed in Tomita et al., "1-W 3.3-16.3-V boosting wireless power oscillator circuits with vector summing power controller," IEEE JSSC, vol. 47, pp. 2576-2585, November 2012 (the disclosure of which is incorporated by reference), where two power stages separately drive two series resonant circuits and both drivers are magnetically coupled with the secondary inductance. By controlling the phase relation between the driver's signals, the output power can effectively reach two times the power delivered by a single stage.

SUMMARY

One aspect of the present disclosure is to provide a power oscillator apparatus with transformer-based power combining which is able to deliver higher levels of output power with high efficiency compared to known prior art apparatus.

One aspect of the present disclosure is a power oscillator apparatus comprising: a first power oscillator and a second power oscillator arranged in series between a supply voltage and a reference voltage, an electromagnetic network for coupling the first and the second oscillator, characterized by comprising a transformer with a primary circuit including a first portion connected to the first oscillator and second portion connected to the second oscillator, a circuit element for reusing the current used in the first oscillator even into the second oscillator, an output stage of the apparatus comprising a secondary circuit of the transformer, the first and the second oscillator being configured to receive a synchronizing signal for their synchronization in frequency and phase and said secondary circuit being magnetically coupled with the first and the second portion of the primary circuit to obtain an output power as combination of a first power associated to the first portion and a second power associated to the second portion of the primary circuit.

In an embodiment, an apparatus comprises: a first oscillator circuit having a first output and a second output; a second oscillator circuit having a third output and a fourth output; and a transformer circuit comprising: a first primary winding coupled between the first output and a common node; a second primary winding coupled between the second output and the common node; a third primary winding coupled between the third output and the common node; a fourth primary winding coupled between the fourth output and the common node; and a first secondary winding and second secondary winding coupled in series between fifth and sixth output nodes, wherein the first secondary winding is magnetically coupled to the first and third primary windings, and wherein the second secondary winding is magnetically coupled to the second and fourth primary windings.

In an embodiment, an apparatus comprises: a first oscillator circuit having a first output and a second output; a second oscillator circuit having a third output and a fourth output; a transformer having a primary winding including a first portion coupled between the first and second outputs of the first oscillator circuit and a second portion coupled between the third and fourth outputs of the second oscillator circuit, and further including a secondary winding having a third portion coupled in series with a fourth portion, wherein the third portion is magnetically coupled to the first and second portions of the primary winding and wherein the fourth portion is magnetically coupled to the first and second portions of the primary winding; wherein the first and second oscillator circuits and the transformer are integrated in an integrated circuit device including a plurality of metallization levels; and wherein said primary and secondary windings are formed in said plurality of metallization layers.

BRIEF DESCRIPTION OF THE DRAWINGS

For a better understanding of the present invention, a preferred embodiments thereof are now described, purely by way of non-limiting example and with reference to the annexed drawings, wherein.

DETAILED DESCRIPTION OF THE DRAWINGS

Figure 1:
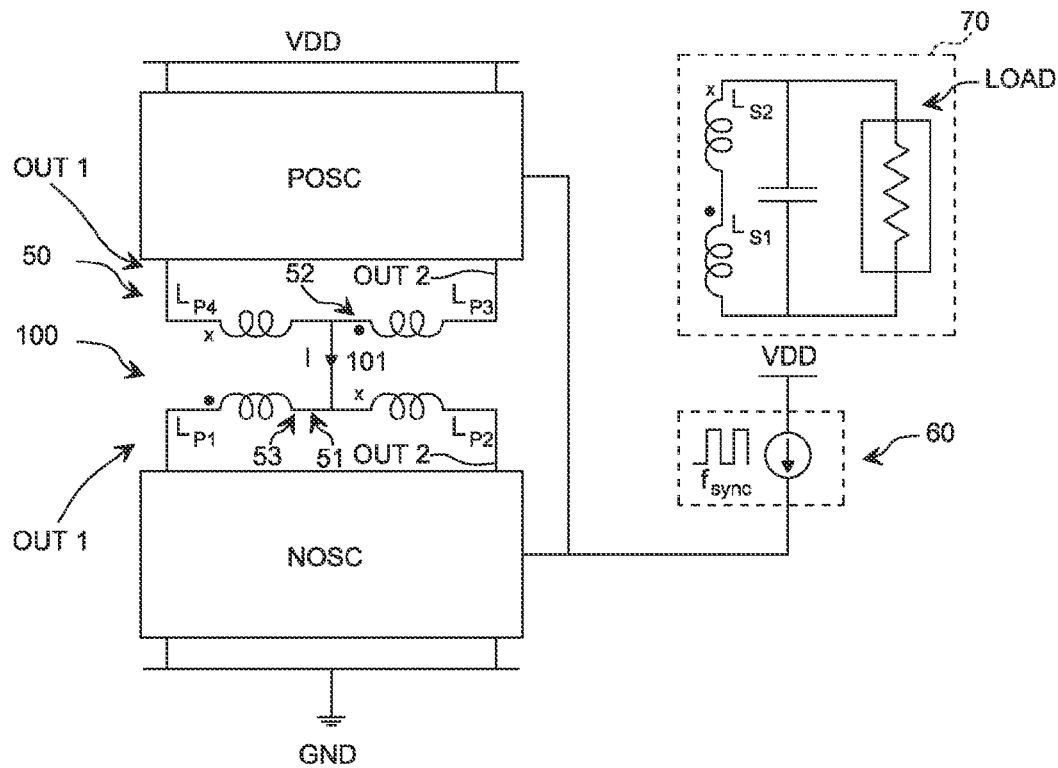
FIG. 1 shows a power oscillator apparatus according to the present disclosure.

FIG. 1 shows a power oscillator apparatus according to the present disclosure.

The power oscillator apparatus comprises a first power oscillator POSC and a second power oscillator NOSC arranged in series between a supply voltage VDD and a reference voltage, for example ground GND.

The power oscillator apparatus comprises an electromagnetic network 100 configured to couple the oscillators POSC and NOSC each one having two output terminals OUT1, OUT2.

The power oscillator apparatus comprises a transformer 50. The primary circuit 51 comprises a first portion 52 connected to the first oscillator POSC and a second portion 53 connected to the second oscillator NOSC; the first portion 52 is connected with the output terminals OUT1, OUT2 of the first oscillator POSC while the second portion 53 is connected with the output terminals OUT1, OUT2 of the second oscillator NOSC.

The primary circuit of the transformer comprises preferably four primary winding inductors $L_{P1}$-$L_{P4}$ wherein the first portion 52 comprises two winding inductors and the second portion 53 comprises the other two winding inductors.

The power oscillator apparatus comprises a circuit element 101 to allow the reuse of the current I passing through the first oscillator even into the second oscillator NOSC; the circuit element 101 is preferably the common center tap of the first 52 and second 53 portion of the primary circuit 51 of the transformer 50.

The power oscillator apparatus receives a synchronizing signal Ipulse for the synchronization in frequency and phase of the first POSC and the second NOSC oscillators; the synchronizing signal Ipulse derives from a synchronizing circuit 60, preferably included in the power oscillator apparatus. The synchronization frequency $f_{sync}$ of the the synchronizing signal Ipulse is equal about to $2*f_{osc}$ where $f_{osc}$ is the oscillation frequency of the each oscillator NOSC, POSC. The synchronizing circuitry 60 forces the oscillators POSC and NOSC to operate in phase, so that the voltages applied across the winding or coils $L_{P1}$-$L_{P4}$, denoted with the same symbol (i.e., dot or cross), are at the same time all positive or all negative.

The power oscillator apparatus comprises an output stage 70 including the secondary circuit $L_{S1}$ and $L_{S2}$ of the transformer which is connectable with a load LOAD, for example a rectifier. The secondary circuit $L_{S1}$, $L_{S2}$ is magnetically coupled with the primary circuit to obtain an output power Pout which is a power combining of a first power P1 associated to the first portion 52 of the primary circuit and a second power P2 associated to the second portion 53 of the primary circuit. The transformer 50 allows the galvanic isolation between the oscillators NOSC, POSC and the output stage 70 of the power oscillator apparatus.

Figure 2:
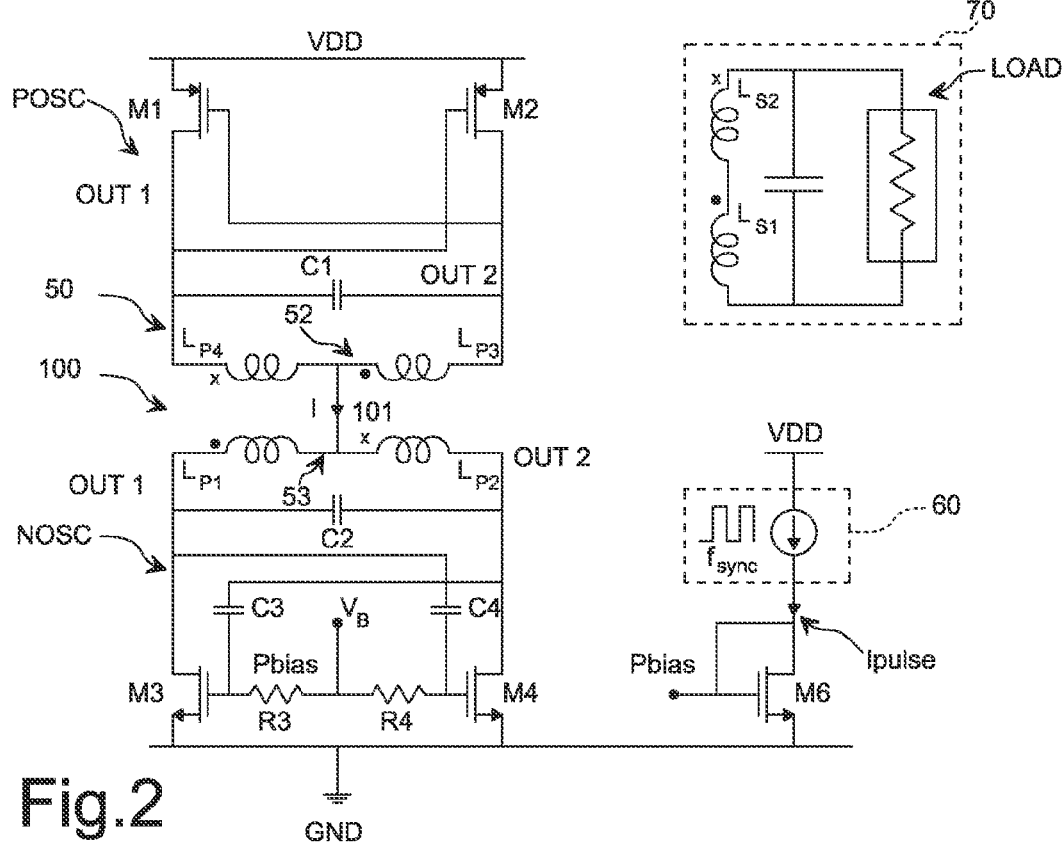
FIG. 2 shows a power oscillator apparatus according to a first embodiment of the present disclosure.

FIG. 2 shows a power oscillator apparatus according to a first embodiment of the present disclosure. The oscillators POSC and NOSC are implemented by complementary oscillators; the oscillators POSC and NOSC may be implemented in either bipolar or CMOS technologies. FIG. 2 shows the oscillators POSC and NOSC implemented in CMOS technologies.

The oscillator POSC comprises a first PMOS transistor M1 and a second PMOS transistor M2 which have the source terminals connected to the supply voltage VDD and are cross-coupled, that is the gate terminal of the transistor M1 is in common with the drain terminal of the transistor M2 and the gate terminal of the transistor M2 is in common with the drain terminal of the transistor M1.

The oscillator NOSC comprises a first NMOS transistor M3 and a second NMOS transistor M4 which have the source terminals connected to ground GND and the gate terminals connected by means of the resistances R3 and R4 with the bias voltage $V_B$ at the bias terminal Pbias. The oscillator NOSC comprises a capacitor C3 connected with the gate terminal of the transistor M3 and the drain terminal of the transistor M4 and another capacitor C4 connected with the gate terminal of the transistor M4 and the drain terminal of the transistor M3.

The electromagnetic network 100 configured to couple the oscillators POSC and NOSC is of the inductive type and comprises the primary circuit 51 of the transformer 50. The primary circuit 51 comprises the first portion 52 including the series of coils $L_{P4}$ and $L_{P3}$ associated to the oscillator POSC and the second portion 53 including the series of the coils $L_{P1}$ and $L_{P2}$ associated to the oscillator NOSC; the coupling between the oscillators POSC and NOSC is assured by the magnetic coupling of the coils $L_{P4}$ and $L_{P2}$ denoted by the symbol cross and the magnetic coupling of the coils $L_{P1}$ and $L_{P3}$ denoted by the symbol dot.

A capacitor C1 is connected between the drain terminals of the transistors M1 and M2 and forms with the coils $L_{P4}$ and $L_{P3}$ a resonant tank LC while a capacitor C2 is connected between the drain terminals of the transistors M3 and M4 and forms with the coils $L_{P1}$ and $L_{P2}$ another resonant tank LC.

The secondary circuit of the transformer 50 comprises the series of the coils $L_{S1}$ and $L_{S2}$ wherein the coil $L_{S1}$ is magnetically coupled with the coils $L_{P1}$ and $L_{P3}$ of the primary circuit and the coil $L_{S2}$ is magnetically coupled with the coils $L_{P2}$ and $L_{P4}$ of the primary circuit. The output power Pout relative to the series of the coils $L_{S1}$ and $L_{S2}$ is a power combining of each power contribution $P_{LP1}$-$P_{LP4}$ of the respective coil $L_{P1}$, $L_{P2}$, $L_{P3}$ and $L_{P4}$ of the primary circuit 51.

When the transistor M1 is on and the transistor M2 is off the current I flows through the coils $L_{P4}$ and $L_{P2}$ and the transistor M4 while when the transistor M2 is on and the transistor M1 is off the current I flows through the coils $L_{P3}$ and $L_{P1}$ and the transistor M3. The values of inductors $L_{P2}$, $L_{P3}$ $L_{P4}$ and capacitors C1 and C2 are related to the oscillation frequency $f_{OSC}$ that is typically in the range between hundreds of megaHertz to several gigahertz. Therefore, in a typical integrated implementation of the proposed solution inductors and capacitors of a few nanoHerny and picoFarad are used, respectively.

Figure 3:
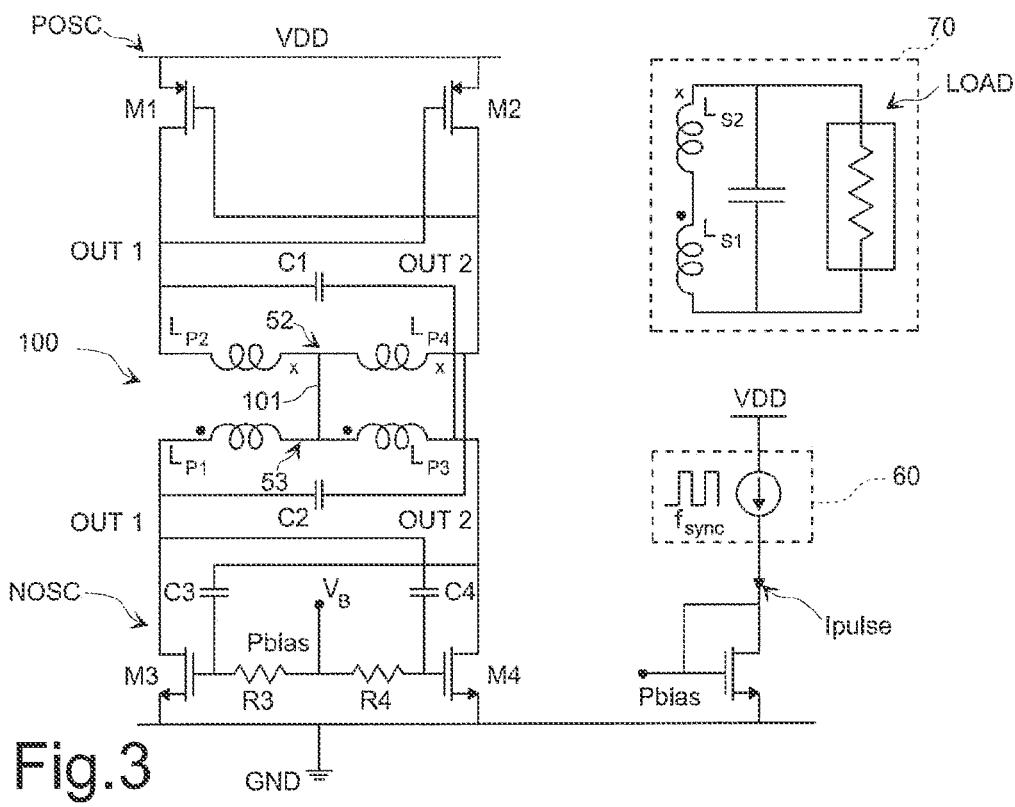
FIG. 3 shows a a power oscillator apparatus according to a second embodiment of the present disclosure.
Figure 4:
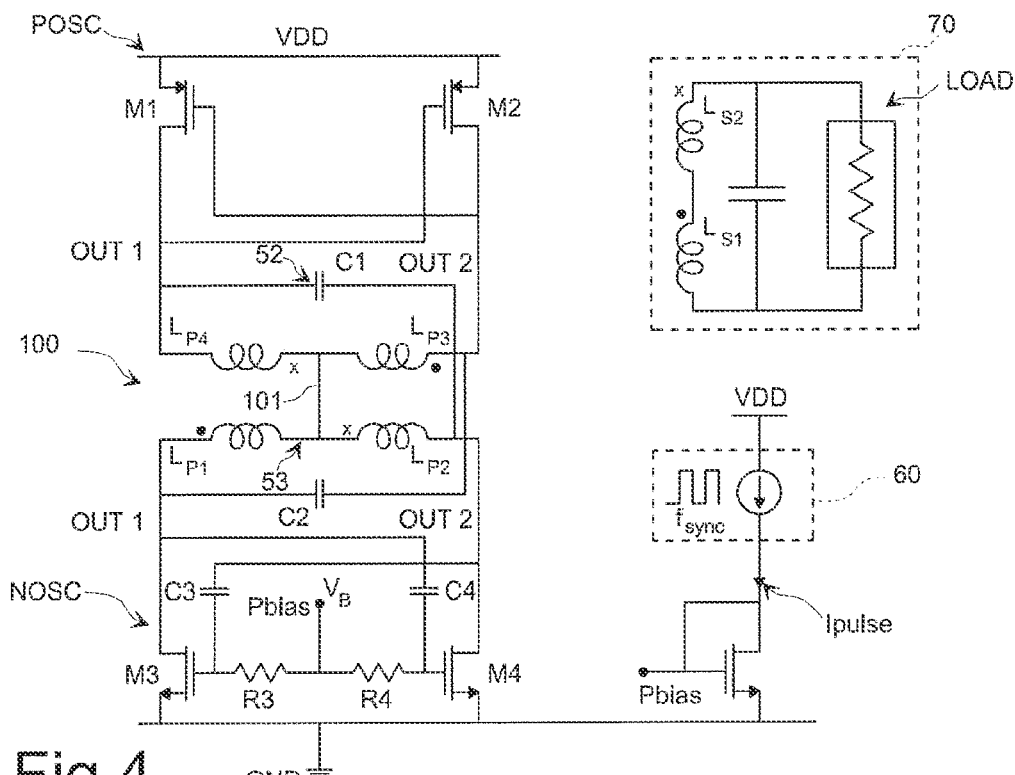
FIG. 4 shows a power oscillator apparatus according to a third embodiment of the present disclosure.
Figure 6:
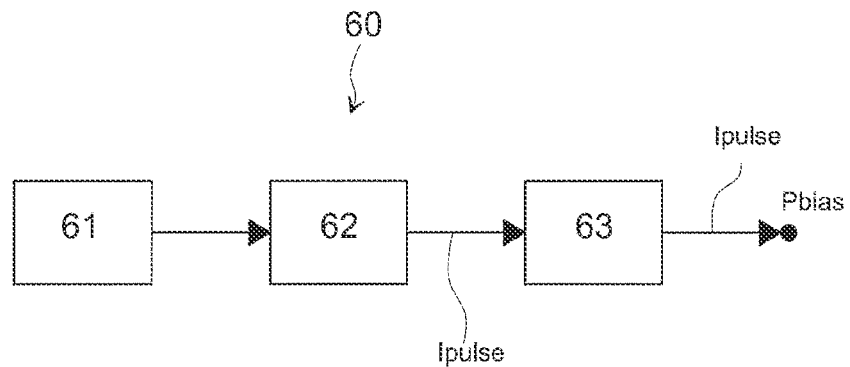
FIG. 6 shows more in detail the synchronizing circuit in FIGS. 2-4.

The synchronizing circuit 60 uses common-mode current pulses Ipulse. The current pulses are injected into the power oscillator apparatus by using a common-mode bias terminal Pbias, which can be placed in either the oscillators NOSC or POSC and which, in FIGS. 2-4, is arranged in the oscillator NOSC; preferably a NMOS transistor M6 coupled between the circuit 60 (coupled with the supply voltage VDD) and ground GND and with the gate and drain terminal in common and with the drain terminal connected with the circuit 60, allows the use of the terminal Pbias for the injection of the current pulses Ipulse. Current pulses Ipulse have a frequency $f_{sync}$ approximately equal to two times the oscillation frequency $f_{osc}$ of the oscillator POSC, NOSC; current pulses Ipulse have preferably a square-wave shape. Preferably the synchronizing circuitry 60, as shown in FIG. 6, includes a low-power low-accuracy voltage oscillator 61 (e.g., a ring oscillator), a voltage-to-current converter 62 receiving the voltage pulses output from the oscillator 61, and a current buffer 62 receiving the current pulses Ipulse, for example of 1 mA, from the converter 62 and adapted to inject the current pulses Ipulse into the bias terminal Pbias.

The presence of the synchronizing signal Ipulse of the synchronizing circuit 60 is mandatory to avoid NOSC and POSC work at different frequency/phase, thus hindering the power-combining at the output stage 70. The synchronizing circuit 60 drives the second-harmonic (common-mode) current component to both NOSC and POSC, thus setting frequency/phase of NOSC and POSC.

The synchronization signal has no impact on the oscillator efficiency since low-value current pulses are required and synchronization is only required at the circuit start-up. Indeed, after the oscillator is locked in a stable state, it remains indefinitely in this state, regardless signal disturbance.

Figure 5:
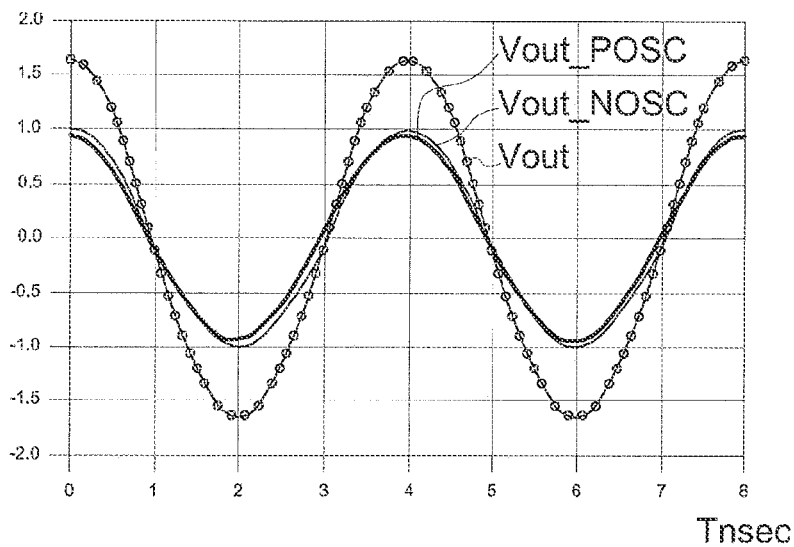
FIG. 5 shows the time diagrams of the some voltages of the power oscillator apparatus in FIG. 2.

FIG. 5 shows a the typical waveforms of the voltages at the coils of the power oscillator apparatus in FIG. 2; Vout_NOSC is the differential voltage across the oscillator NOSC, i.e. the voltage across the series combination of $L_{P1}$ and $L_{P2}$ and Vout_POSC is the differential voltage across the oscillator POSC, i.e. the voltage across the series combination of $L_{P3}$ and $L_{P4}$ while Vout is the differential voltage across the equivalent load LOAD, i.e. the voltage across the series combination of the secondary coils $L_{S2}$ and $L_{S1}$ which is greater than the voltages Vout_POSC and Vout_NOSC but smaller than their sum.

It is clearly shown that due to the phase-relationship between Vout_NOSC and Vout_POSC, the currents forced at the primary coils are at the same time all increasing or all decreasing, and hence the fluxes generated at the primary coils. It follows that the secondary coils will catch this flux (separately, i.e. $L_{S1}$ will catch the flux generated by $L_{P1}$ and $L_{P3}$ and so on), forcing to the load a current proportional to the fluxes. At the secondary side the output voltage will be greater than Vout_NOSC or Vout_POSC, depending on the load resistance and the coupling factor between primary and secondary side, always less than one. The total power at the load LOAD is the sum of the total power applied at the primary side, except for the losses in the series resistance of the windings.

FIG. 3 shows a power oscillator apparatus according to a second embodiment of the present disclosure. Differently from the power oscillator apparatus in FIG. 2, the electromagnetic network 100 configured to couple the oscillators POSC and NOSC of the power oscillator apparatus in FIG. 3 is of the capacitive type; in fact the electromagnetic network 100 comprises the capacitor C1 connected between the first output terminal OUT1 of the first oscillator and the second output terminal OUT2 of the second oscillator and a second capacitor C2 connected between the second output terminal OUT2 of the first oscillator and the first output terminal OUT1 of the second oscillator, that is the capacitor C1 is connected between the drain terminal of the PMOS transistor M1 and the drain terminal of the NMOS transistor M4 and the capacitor C2 is connected between the drain terminal of the PMOS transistor M2 and the drain terminal of the NMOS transistor M3.

Differently from the power oscillator apparatus in FIG. 2, the first portion 52 of the primary circuit 51 of the transformer 50 comprises the series of the coils $L_{P2}$ and $L_{P4}$ connected between the drain terminals of the PMOS transistors M1 and M2 and the second portion 53 of the primary circuit 51 comprises the series of the coils $L_{P1}$ and $L_{P3}$ connected between the drain terminals of the NMOS transistors M3 and M4.

The secondary circuit of the transformer 50 comprises the series of the coils $L_{S1}$ and $L_{S2}$ wherein the coil $L_{S1}$ is magnetically coupled with the coils $L_{P1}$ and $L_{P3}$ of the primary circuit and the coil $L_{S2}$ is magnetically coupled with the coils $L_{P2}$ and $L_{P4}$ of the primary circuit. The output power Pout relative to the series of the coils $L_{S1}$ and $L_{S2}$ is a power combining of each power contribution $P_{LP1}$-$P_{LP4}$ of the respective coil $L_{P1}$, $L_{P2}$, $L_{P3}$ and $L_{P4}$ of the primary circuit 51.

FIG. 4 shows a power oscillator apparatus according to a third embodiment of the present disclosure. Differently from the power oscillator apparatus in FIG. 2, the electromagnetic network 100 configured to couple the oscillators POSC and NOSC of the power oscillator apparatus in FIG. 3 is of the capacitive and inductive type; in fact the electromagnetic network 100 comprises the capacitor C1 connected between the first output terminal OUT1 of the first oscillator POSC and the second output terminal OUT2 of the second oscillator NOSC and a second capacitor C2 connected between the second output terminal OUT2 of the first oscillator and the first output terminal OUT1 of the second oscillator, that is the capacitor C1 is connected between the drain terminal of the PMOS transistor M1 and the drain terminal of the NMOS transistor M4 and the capacitor C2 is connected between the drain terminal of the PMOS transistor M2 and the drain terminal of the NMOS transistor M3.

Also the electromagnetic network 100 comprises the primary circuit 51 of the transformer 50. The electromagnetic network 100 comprises the series of coils $L_{P4}$ and $L_{P3}$ associated to the oscillator POSC, that is connected to the output terminals OUT1 and OUT2 of the oscillator POSC, and the series of the coils $L_{P1}$ and $L_{P2}$ associated to the oscillator NOSC, that is connected to the output terminals OUT1 and OUT2 of the oscillator NOSC; the coupling between the oscillators POSC and NOSC is assured by the magnetic coupling of the coils $L_{P4}$ and $L_{P2}$ denoted by the symbol cross and the magnetic coupling of the coils $L_{P1}$ and $L_{P3}$ denoted by the symbol dot.

For all the embodiments in FIGS. 2-4, the transformer topology comprises two separated magnetic circuits, whose common fluxes are marked by dots (i.e., $L_{P1,3}$ with $L_{S1}$) and crosses (i.e., $L_{P2,4}$ with $L_{S2}$), respectively. Dots and crosses are placed according to the common flux conventions.

Figure 7:
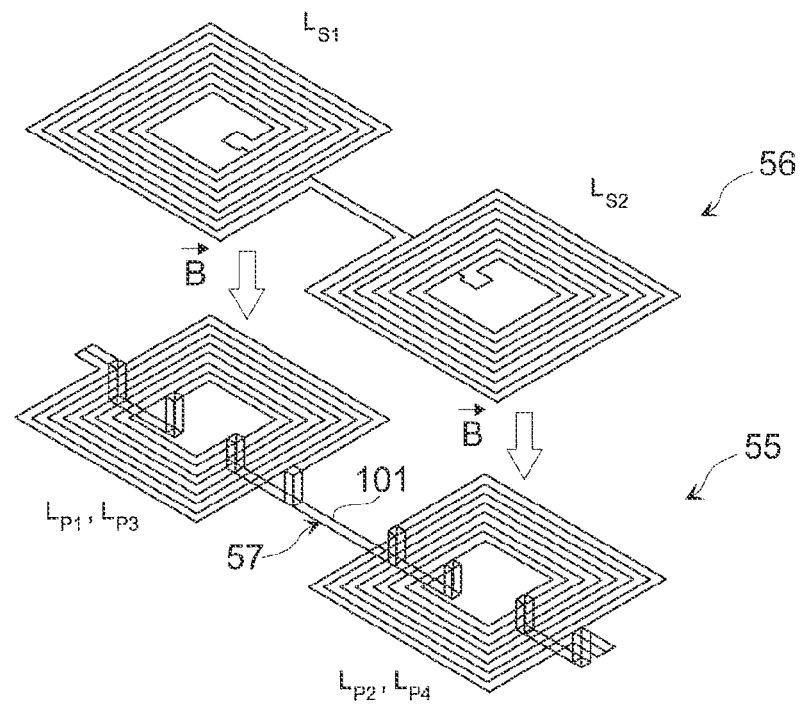
FIG. 7 is a schematic tridimensional view of an implementation of the structure of the transformer of FIG. 2.
Figure 8:
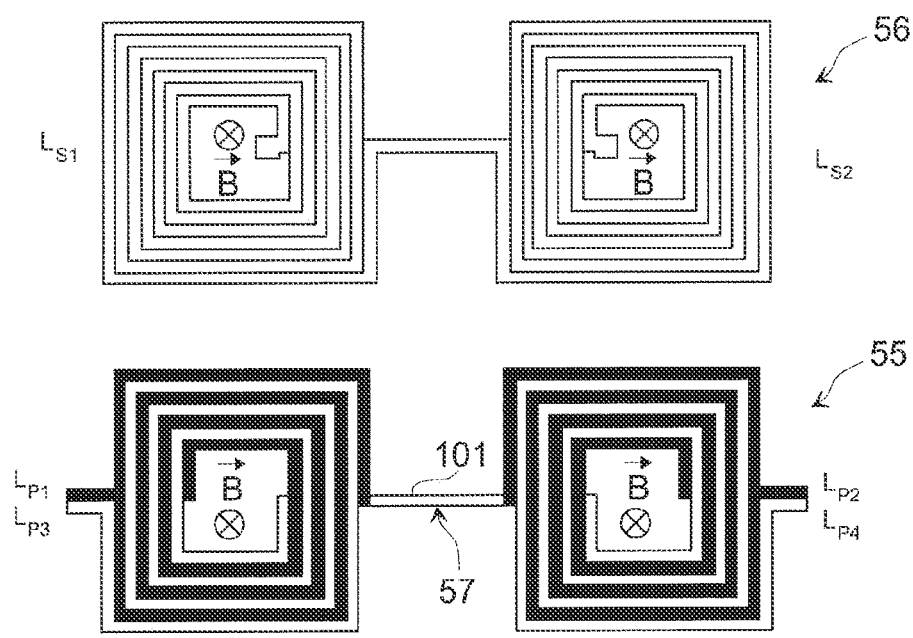
FIG. 8 is schematic planar view of the implementation of the structure of the transformer of FIG. 7.

In accordance with the power oscillator apparatus of the present disclosure it is possible to perform an integrated circuit comprising the power oscillator apparatus as shown in each one of the FIGS. 1-4. The integrated circuit shows a physical monolithic implementation for the transformer 50 using only three metal layers. FIG. 7 shows a schematic tridimensional view of the structure of the transformer 50 while FIGS. 8-11 show schematic planar views of primary $L_{P1}$-$L_{P4}$ and secondary $L_{S1}$, $L_{S2}$ windings. FIG. 8 is the planar view of transformer 50 related to the tridimensional view of FIG. 7. A stacked arrangement for the transformer 50 comprises the primary coils $L_{P1}$-$L_{P4}$ performed in the mid-level or intermediate metal layer 55 and the secondary coils $L_{S1}, L_{S2}$ performed in the top metal layer 56; preferably the primary coils $L_{P1}$-$L_{P4}$ and the secondary coils $L_{S1}, L_{S2}$ are provided in the form or metal spirals. The common center tap 101 may be performed in the bottom metal layer 57 or in the intermediate metal layer 55. The integrated circuit is performed in a chip of semiconductor material and the transistors M1-M4 and the other elements of the oscillators POSC and NOSC except the transformer 50 are performed according to the known technology.

The four inductors $L_{P1}$-$L_{P4}$ of the primary coils are arranged using two symmetric interleaved configurations, one for each secondary coupled coils $L_{S1}$, $L_{S2}$, with a common terminal for the center-tap 101. Underpasses are performed in the bottom metal layer 57 and are only used to contact the inductors terminals and preferably the center-tap 101. Secondary coils $L_{S1}$, $L_{S2}$ are stacked on top of primary coils $L_{P1}$-$L_{P4}$ and series-connected to build the secondary winding. Their inner terminals are contacted by bonding wires. The primary coils $L_{P1}$, $L_{P3}$ (with the winding $L_{P1}$ in black and the winding $L_{P3}$ in white) are arranged in a interleaved configuration under the secondary coil $L_{S1}$ and the primary coils $L_{P2}$, $L_{P4}$ (with the winding $L_{P2}$ in black and the winding $L_{P4}$ in gray) are arranged in a interleaved configuration under the secondary coil $L_{S2}$.

The stacked configuration between primary and secondary windings is inherently suitable to obtain galvanic isolation, provided that suitable dielectric layer between the intermediate metal layer 55 and the top metal layer 56 is used. For the sake of clarity, FIGS. 7-11 are only an example of implementation. Indeed, the shape, the number of turns and the turn ratio between primary and secondary windings may vary. Moreover, if more metal layers are available, multi-layer shunt-connected spirals can be exploited to reduce the series resistances of the coils. Patterned ground shields can be implemented below the primary windings to reduce substrate losses if necessary.

Figure 9:
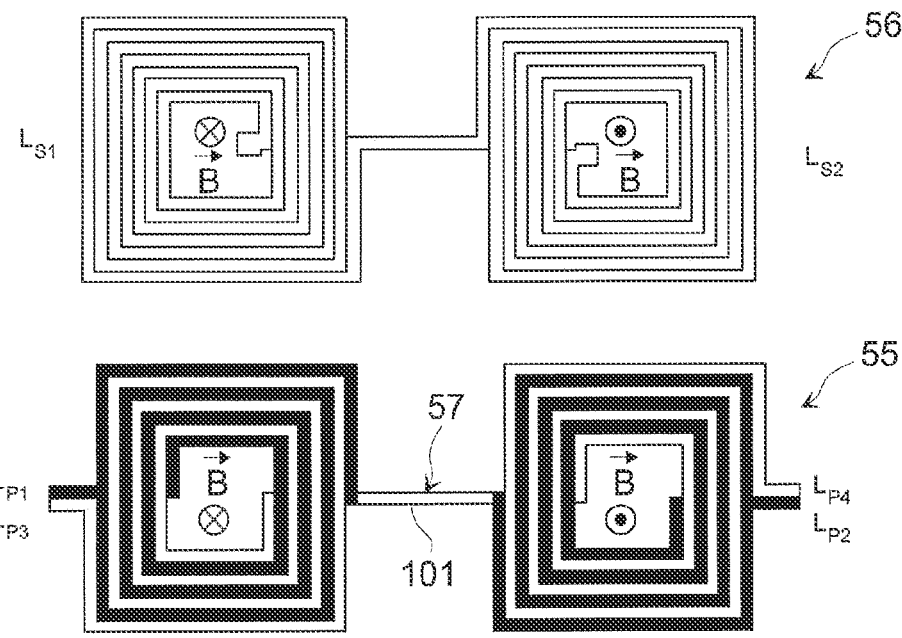
FIG. 9 is schematic planar view of another implementation of the structure of the transformer of FIGS. 2 and 3.

For both schematics in FIGS. 2 and 3, an alternative implementation of the transformer is reported in the planar view in FIG. 9. It mainly differs from the one shown in FIG. 8 for the magnetic fields B that are in opposite phase between coils at the left side, $L_{P1}$, $L_{P3}$ and $L_{S1}$, and the right side, $L_{P2}$, $L_{P4}$ and $L_{S2}$, of the structure. This configuration allows lower electromagnetic interferences to be achieved.

Figure 10:
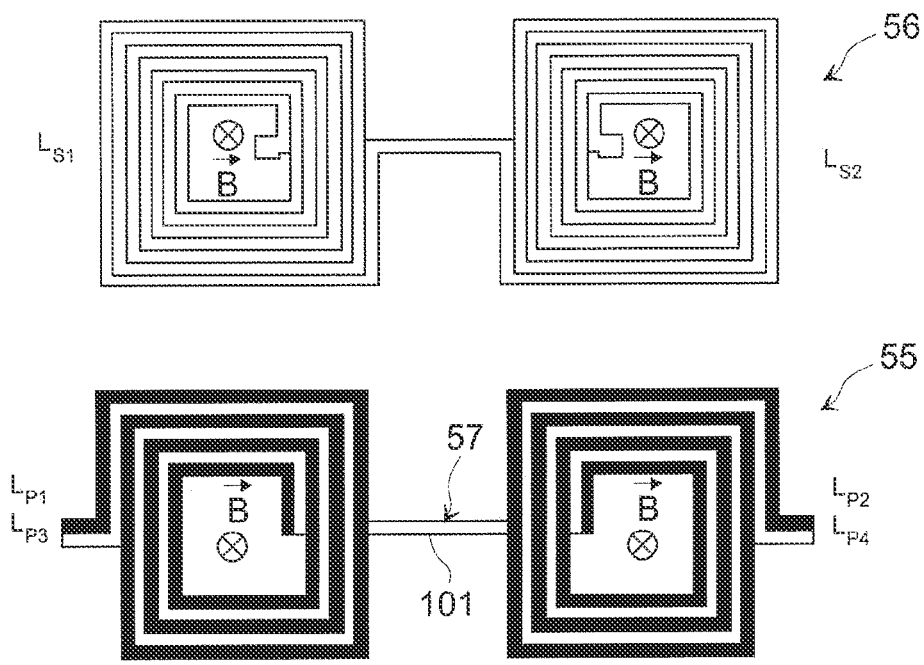
FIG. 10 is schematic planar view of an implementation of the structure of the transformer of FIG. 4.
Figure 11:
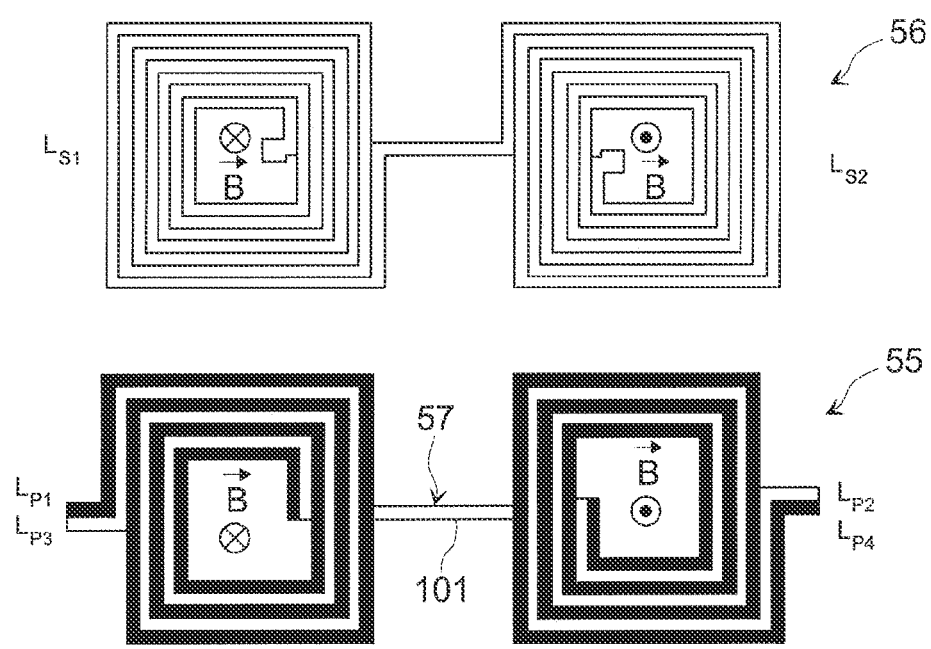
FIG. 11 is schematic planar view of another implementation of the structure of the transformer of FIG. 4.

For the schematic in FIG. 4 two alternative implementations of the transformer 50 are shown in FIGS. 10 and 11. These implementations use two different interleaved transformers at the primary side, while the secondary is the same as the previous solutions in FIGS. 8 and 9, respectively. FIG. 10 shows the primary coils $L_{P1}$, $L_{P3}$ arranged in an interleaved configuration under the secondary coil $L_{S1}$ and the primary coils $L_{P2}$, $L_{P4}$ arranged in an interleaved configuration under the secondary coil $L_{S2}$ with the magnetic fields B that are in phase between the coils while FIG. 11 shows the primary coils $L_{P1}$, $L_{P3}$ arranged in an interleaved configuration under the secondary coil $L_{S1}$ and the primary coils $L_{P2}$, $L_{P4}$ (with the winding $L_{P2}$ in white and the winding $L_{P4}$ in black) arranged in an interleaved configuration under the secondary coil $L_{S2}$ with the magnetic fields B that are in opposite phase between coils at the left side, $L_{P1}$, $L_{P3}$ and $L_{S1}$, and the right side, $L_{P2}$, $L_{P4}$ and $L_{S2}$, of the structure.

Compared to the implementations in FIGS. 8 and 9 this arrangement needs only one underpass.

Compared to the typical apparatuses, the power oscillator apparatus shown in FIG. 1-11 is able to deliver higher levels of power, while providing higher efficiency. Indeed, it is able to overcome the limitations of the oscillating voltage due to the breakdown voltage thanks to a transformer-based power combining technique. The efficiency is further increased thanks to the current-reuse approach. Finally, the mixed stacked-interleaved configuration that is proposed for the transformer implementation allows low-area consumption to be achieved. The transformer structure is inherently suited for (integrated) galvanic isolation, provided that a proper dielectric layer is used. Moreover, it is easy to obtain a high voltage boosting ratio between the secondary and the primary side by taking advantage of the number of turn ratio.

It is worth noting that when inductive coupling is adopted between primary coils, as in the configurations shown in FIGS. 2, 3 and 4, the equivalent resonator inductance, $L_{eq}$ is increased according to the following expression:

$$L_{eq} = (L_{P1,3} + L_{P2,4}) \cdot (1 + k_P)$$

where $k_P$ is the magnetic coupling factor between the primary coils. This achievement allows obtaining a significant area reduction compared to no-coupled coils. The proposed invention can be implemented in different approaches: in a monolithic solution, using a post-processing for the dielectric and the secondary coil, using two face-to-face dice with a post-processing for the dielectric, as the approach described in United State Patent Application Publication No. 2012/0256290 (incorporated herein by reference) or using a system-in-package approach with a post-processed transformer according to the Analog Device Inc. isoPower® technology.

A non-limiting design implementation of the apparatus shown in FIG. 2 is reported below for a typical 0.35-μm CMOS process. Considering $f_{osc}$=250 MHz, $f_{sync}$=500 MHz, Ipulse=1.5 mA, VDD=3 V, $L_{P1}$=$L_{P2}$=$L_{P3}$=$L_{P4}$=5 nH, $L_{S1}$=$L_{S2}$=10 nH, $k_{P1,3}$=$k_{P2,4}$=$k_P$=0.6 (i.e., magnetic coupling factor between primary coils 51), $k_{P1,3-S1}$=$k_{P2,4-S2}$=0.8 (i.e., magnetic coupling factor between primary coils 51 and secondary coils in the output stage 70), C1=C2=17 pF (excluding the parasitic capacitor of active devices M1-M4), C3=C4=10 pF, LOAD=60Ω, R3=R4=1 kΩ. The circuit behavior can be explained as the superposition of two in-phase oscillators (i.e., NOSC and POSC) in which, as in classical cross-coupled topologies, transistors M1-M2 and M3-M4 provide the non-linear negative conductance required to sustain the steady-state oscillation. The cross-coupled connection in the NOSC is guaranteed by the high-pass RC circuit formed by R3-C3 and R4-C4, respectively, thus allowing a bias terminal Pbias to be available for the connection of the biasing/synchronization circuitry. The oscillator resonant tanks are the LC parallel networks made up by $L_{P1}$, $L_{P2}$, C1 and $L_{P4}$, C2 for the NOSC and POSC, respectively. The tanks are tuned at about $f_{osc}$ and therefore the differential voltage waveforms at the output terminals (i.e., OUT1 and OUT2) of each oscillator are forced to be almost sinusoidal at $f_{osc}$. The presence of magnetic couplings between primary coils 51, increases the equivalent inductance according to the following expression: $L_{eq}$=($L_{P1,3}$+$L_{P2,4}$)·(1+$k_P$). The phase-relationship between Vout NOSC (i.e., the voltage between the terminals OUT1-OUT2 of the oscillator NOSC) and Vout POSC (the voltage between the terminals OUT1-OUT2 of the oscillator POSC) is due to the primary coupling configuration, as well as the common-mode synchronizing signal at $f_{sync}$ (i.e., at 2 times $f_{osc}$). Therefore, the currents forced at the primary coils are at the same time all increasing or all decreasing, and hence the fluxes generated at the primary coils. It follows that the secondary coils will catch this flux (separately, i.e. $L_{S1}$ will catch the flux generated by $L_{P1}$ and $L_{P3}$ and so on), forcing to the load a current proportional to the fluxes. At the secondary side the output voltage will be greater than Vout_NOSC or Vout_POSC. The total power at the load is the sum of the total power applied at the primary side, except for the losses in the series resistance of the windings.

To deliver high level of power with high efficiency, transistors M1-M4 have to work as switches with very low on resistances. Moreover, the loss reduction in the transformer is highly related to the availability of low-resistance metal layers (55, 56 and 57) to obtain high quality-factor coils.

What is claimed is:

1. An apparatus, comprising:
   a first oscillator circuit having a first output and a second output;
   a second oscillator circuit having a third output and a fourth output; and
   a transformer circuit comprising:
      a first primary winding coupled between the first output and a common node;
      a second primary winding coupled between the second output and the common node;
      a third primary winding coupled between the third output and the common node;
      a fourth primary winding coupled between the fourth output and the common node; and
      a first secondary winding and second secondary winding coupled in series between fifth and sixth output nodes, wherein the first secondary winding is magnetically coupled to the first and third primary windings, and wherein the second secondary winding is magnetically coupled to the second and fourth primary windings.

2. The apparatus of claim 1, wherein an output power at the fifth and sixth output nodes is a combination of a first power associated with the first and second primary windings and a second power associated with the third and fourth primary windings.

3. The apparatus of claim 1, further comprising:
   a first capacitor coupled between the first output and the second output; and
   a second capacitor coupled between the third output and the fourth output.

4. The apparatus of claim 1, further comprising:
   a first capacitor coupled between the first output and the third output; and
   a second capacitor coupled between the second output and the fourth output.

5. The apparatus of claim 1, further comprising a capacitor coupled between the fifth and sixth outputs.

6. The apparatus of claim 1, wherein the first oscillator circuit comprises a pair of transistors coupled to the first and second outputs and having control terminal coupled together to receive a bias signal.

7. The apparatus of claim 6, wherein the bias signal is a synchronizing signal for synchronizing frequency and phase of oscillator operation.

8. The apparatus of claim 7, further comprising:
   a current source configured to generate a synchronizing current pulse; and
   a current mirror configured to mirror the synchronizing current pulse to the control terminals of the pair of transistors.

9. The apparatus of claim 7, wherein the synchronizing signal has a synchronization frequency equal to two times an oscillation frequency of the first and second oscillator circuits.

10. The apparatus of claim 1, further comprising a common-mode bias terminal provided in one of said first and second oscillator circuits for receiving a pulsed synchronizing signal.

11. The apparatus of claim 1, wherein said transformer circuit is formed by a plurality of windings arranged in a stacked configuration, wherein the first and second secondary windings are formed in a first metal layer and wherein the first, second, third and fourth primary windings are formed in a second metal layer.

12. The apparatus of claim 11,
   wherein the first and third primary windings are coplanar and interleaved in the second metal layer and the first secondary winding is positioned in alignment with the first and third primary windings; and
   wherein the second and fourth primary windings are coplanar and interleaved in the second metal layer and the second secondary winding is positioned in alignment with the second and fourth primary windings.

13. An apparatus, comprising:
   a first oscillator circuit having a first output and a second output;
   a second oscillator circuit having a third output and a fourth output;
   a transformer having a primary winding including a first portion coupled between the first and second outputs of the first oscillator circuit and a second portion coupled between the third and fourth outputs of the second oscillator circuit, and further including a secondary winding having a third portion coupled in series with a fourth portion;
   wherein the third portion of the secondary winding is magnetically coupled to the first portion of the primary winding so as to form a first magnetic circuit and wherein the fourth portion of the secondary winding is magnetically coupled to the second portion of the primary winding so as to form a second magnetic circuit;
   wherein the first and second oscillator circuits and the transformer are integrated in an integrated circuit device including a plurality of metallization levels;
   wherein said primary and secondary windings are formed in said plurality of metallization layers;
   wherein the first portion of said primary winding comprises a first winding and a second winding coupled in series at a common node; and
   wherein the second portion of said primary winding comprises a third winding and a fourth winding coupled in series at said common node.

14. The apparatus of claim 13, wherein an output power from the secondary winding is a combination of a first power associated with the first and second portions of the primary winding.

15. The apparatus of claim 13, wherein said first through fourth windings of the primary winding are formed in a first layer of said metallization layers and said secondary winding is formed in a second layer of said metallization layers.

16. The apparatus of claim 15, wherein said first and third windings are interleaved and wherein said second and fourth windings are interleaved.

17. The apparatus of claim 16,
   wherein the third portion of said secondary winding comprises a fifth winding;
   wherein the fourth portion of said secondary winding comprises a sixth winding;
   said fifth and sixth windings coupled in series.

18. The apparatus of claim 17,
wherein said fifth winding is formed in said second layer over the interleaved first and third windings formed in said first layer; and
wherein said sixth winding is formed in said second layer over the interleaved second and fourth windings formed in said first layer.

19. The apparatus of claim 13,
wherein said first oscillator circuit includes a first capacitor coupled between the first output and second output; and
wherein said second oscillator includes a second capacitor coupled between the third output and fourth output.

20. The apparatus of claim 13,
wherein said first oscillator includes a first capacitor coupled between the first output and the fourth output; and
wherein said second oscillator includes a second capacitor coupled between the second output and the third output.

21. The apparatus of claim 13, further comprising a synchronization circuit configured to generate a synchronizing signal for application to a common mode node of at least one of the first and the second oscillator circuits for synchronization of frequency and phase.

22. An apparatus, comprising:
a first oscillator circuit having a first output and a second output;
a second oscillator circuit having a third output and a fourth output;
a transformer having a primary winding including a first portion coupled between the first and second outputs of the first oscillator circuit and a second portion coupled between the third and fourth outputs of the second oscillator circuit, and further including a secondary winding having a third portion coupled in series with a fourth portion;
wherein the first portion of said primary winding comprises a first winding and a second winding coupled in series at a common node;
wherein the second portion of said primary winding comprises a third winding and a fourth winding coupled in series at said common node;
wherein the third portion is magnetically coupled to the first and second portions of the primary winding and wherein the fourth portion is magnetically coupled to the first and second portions of the primary winding;
wherein the first and second oscillator circuits and the transformer are integrated in an integrated circuit device including a plurality of metallization levels; and
wherein said primary and secondary windings are formed in said plurality of metallization layers.

23. The apparatus of claim 22, wherein said first through fourth windings of the primary winding are formed in a first layer of said metallization layers and said secondary winding is formed in a second layer of said metallization layers.

24. The apparatus of claim 23, wherein said first and third windings are interleaved and wherein said second and fourth windings are interleaved.

25. The apparatus of claim 24,
wherein the third portion of said secondary winding comprises a fifth winding;
wherein the fourth portion of said secondary winding comprises a sixth winding;
wherein said fifth and sixth windings are coupled in series.

26. An apparatus, comprising:
a first oscillator circuit having a first output and a second output;
a second oscillator circuit having a third output and a fourth output;
a transformer having a primary winding including a first portion coupled between the first and second outputs of the first oscillator circuit and a second portion coupled between the third and fourth outputs of the second oscillator circuit, and further including a secondary winding having a third portion coupled in series with a fourth portion;
wherein the third portion is magnetically coupled to the first and second portions of the primary winding and wherein the fourth portion is magnetically coupled to the first and second portions of the primary winding;
wherein the first and second oscillator circuits and the transformer are integrated in an integrated circuit device including a plurality of metallization levels;
wherein said primary and secondary windings are formed in said plurality of metallization layers; and
a synchronization circuit configured to generate a synchronizing signal for application to a common mode node of at least one of the first and the second oscillator circuits for synchronization of frequency and phase.

* * * * *